United States Patent [19]

Lesk et al.

[11] Patent Number: 4,491,604
[45] Date of Patent: Jan. 1, 1985

[54] SILICON DEPOSITION PROCESS

[76] Inventors: Israel A. Lesk, 1750 E. Oregon Ave., Phoenix, Ariz. 85016; Kalluri R. Sarma, 2352 S. Los Altos Ave., Mesa, Ariz. 85202

[21] Appl. No.: 453,654

[22] Filed: Dec. 27, 1982

[51] Int. Cl.³ .......................... B05D 5/12; C23C 11/00
[52] U.S. Cl. ...................................... 427/8; 427/255.1
[58] Field of Search ................ 427/8, 9, 85, 86, 255.1, 427/237; 23/230 A; 423/350

[56] References Cited

U.S. PATENT DOCUMENTS

| 3,745,043 | 7/1973 | Bradley | 427/255.1 |
| 3,824,121 | 7/1974 | Bradley et al. | 427/255.1 |
| 4,084,024 | 4/1978 | Schumacher | 427/255.1 |
| 4,125,643 | 11/1978 | Reuschel et al. | 427/9 |
| 4,148,931 | 4/1979 | Reuschel et al. | 427/8 |
| 4,388,342 | 6/1983 | Suzuki et al. | 427/9 |

FOREIGN PATENT DOCUMENTS 2016339 10/1971 Fed. Rep. of Germany ... 427/255.1

Primary Examiner—Sadie L. Childs

[57] ABSTRACT

A step-wise process is disclosed for the efficient deposition of silicon. The process begins by reacting trichlorosilane and hydrogen on a heated substrate to deposit silicon. Silicon deposition efficiency of this reaction is determined by measuring the silicon to chlorine ratio in the deposition reaction effluent. The silicon-bearing effluent from the deposition reaction includes trichlorosilane, dichlorosilane, and silicon tetrachloride. The silicon-bearing effluent is collected in a first accumulator. The deposition reaction is continued using the collected quantity of silicon-bearing effluent together with an additional quantity of trichlorosilane as an input to the continuing reaction. The additional quantity of trichlorosilane is determined to make up the amount of silicon deposited in the previous step. The process is step-wise continued by measuring the silicon to chlorine ratio in the deposition reactor effluent, collecting an additional quantity of silicon-bearing effluent in a second accumulator, and using this silicon bearing effluent together with an additional quantity of trichlorosilane as an input to the reaction. In each step the ratio of silicon to chlorine in the deposition reactor effluent is measured and the amount of additional makeup trichlorosilane added to the recycled silicon bearing effluent is determined to supply a constant rate of silicon as input to the reaction. The step-wise reaction continues until steady state equilibrium is achieved.

11 Claims, 5 Drawing Figures

SILICON DEPOSITION PROCESS

BACKGROUND OF THE INVENTION

This invention relates to a process for the deposition of silicon, and more particularly to the efficient utilization of silicon bearing effluent in a step-wise silicon deposition process.

Large quantities of high purity silicon are provided for the semiconductor industry by the hydrogen reduction of a silicon-bearing reactant on a heated substrate. In the typical process, for example, trichlorosilane and hydrogen are reacted in a bell jar to deposit silicon on a heated rod such as a rod of pure silicon. The process is highly inefficient in the utilization of available silicon, with only about one-eighth of the available silicon actually depositing on the heated rod. The effluent from the reaction contains the remaining seven-eighths of the available silicon in the form of silicon tetrachloride, small quantities of dichlorosilane, and unreacted trichlorosilane. This silicon-bearing effluent is normally separated by fractional distillation; the silicon tetrachloride is discarded or used as a low value by-product, the dichlorosilane is used in other reactions such as epitaxial deposition, and the trichlorosilane is purified and reused for further silicon deposition. The separation process is costly, time-consuming, and fails to utilize a large fraction of the available silicon.

In view of shortcomings of the aforementioned conventional silicon deposition process it is an object of this invention to provide an improved silicon deposition process.

It is a further object of this invention to provide an improved process for the deposition of silicon which more fully utilizes the silicon available in the input reactants.

It is another object of this invention to provide an improved silicon deposition process having controlled growth parameters.

It is still another object of this invention to provide an improved silicon growth process in which equilibrium is achieved between reaction input and effluent.

BRIEF SUMMARY OF THE INVENTION

The foregoing and other objects and advantages of the invention are achieved through a novel process wherein the silicon-bearing effluent from a silicon growth reaction is step-wise used as a continuing input to the reaction. The deposition of silicon is initiated by reacting trichlorosilane and hydrogen at a hot surface within a deposition reactor. The effluent from the deposition reaction is collected in an effluent accumulator. The ratio of silicon to chlorine in the deposition reactor effluent is measured to determine the silicon deposition efficiency. The deposition reaction is continued using the collected quantity of silicon-bearing effluent together with an additional quantity of trichlorosilane as an input to the deposition reaction. The additional quantity of trichlorosilane is determined from the deposition efficiency of the previous step, and provides an amount of silicon to replace the silicon deposited in that step. The deposition reaction is step-wise continued by collecting a further quantity of effluent, measuring the ratio of silicon to chlorine in the deposition reactor effluent, determining the deposition efficiency, and using the silicon-bearing effluent together with a quantity of additional trichlorosilane as the reaction input. The amount of additional trichlorosilane is determined at each step to supply a constant rate of silicon as input to the reactor. After a few steps of the process, equilibrium is achieved between reaction input and effluent; that is, the quantity and composition of the recycled silicon-bearing effluent at the input of each step are equal to those of the reaction effluent for that step and all of the silicon in the makeup trichlorosilane contributes to silicon deposition. The system then operates in steady state equilibrium.

DETAILED DESCRIPTION OF PREFERRED EMBODIMENTS

Figure 1:
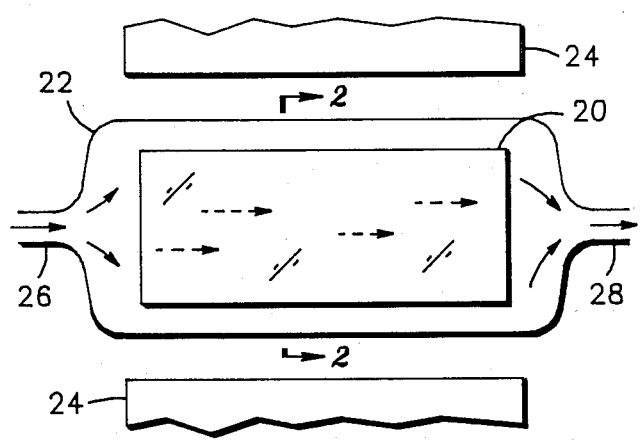
FIG. 1 illustrates one deposition system within which the process in accordance with the invention may be practiced.
Figure 2:
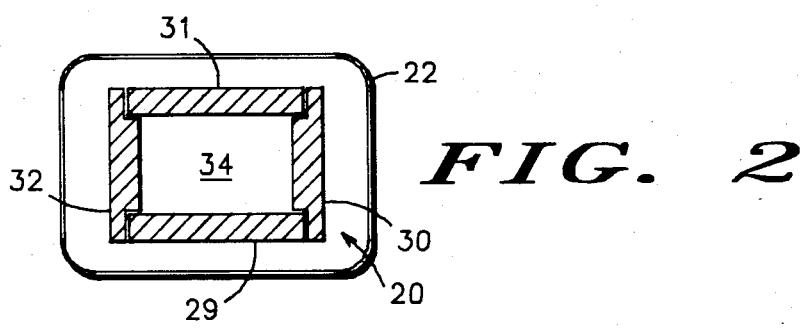
FIG. 2 illustrates a cross-section of the deposition reactor of FIG. 1.

FIG. 1 illustrates one type of apparatus in which the process in accordance with the invention can be practiced, and FIG. 2 illustrates a cross-section through that apparatus as indicated. The apparatus illustrated depicts a "box system" in which the silicon deposition takes place on the interior walls of a box 20. The invention is also applicable to a conventional bell jar system and the like; however, the box system presents a greater surface area for deposition and is therefore more efficient.

The deposition apparatus includes a tube 22 in which box 20 is enclosed. The tube, which may be of quartz or the like, provides means for controlling the ambient within and around the deposition box. A furnace 24 allows deposition box 20 to be heated to the desired reaction temperature. Reactants including silicon-bearing material are admitted through an inlet 26 to tube 22. The reactants pass through the deposition box, polycrystalline silicon is deposited on the heated walls of the box, and reactants are exhausted from tube 22 through an outlet 28.

In one embodiment of the apparatus which is particularly suited for the harvesting of the deposited polycrystalline silicon, box 20 is comprised of demountable sides 29, 30, 31, and 32. The four walls bound a reaction volume 34 within which a reaction takes place to deposit polycrystalline silicon from the input reactant stream on the heated interior walls of the box. After deposition of a predetermined amount of silicon on the box walls, the reaction is terminated, the box removed from the furnace, the box walls demounted, and the silicon removed from the deposition surfaces. The deposition box is made of a refractory material and preferably is a material such as molybdenum coated with graphite. By using graphite coated molybdenum as the deposition substrate, the deposited silicon is easily separated from the deposition surface and the box is then reassembled for reuse in a subsequent deposition.

Figure 3:
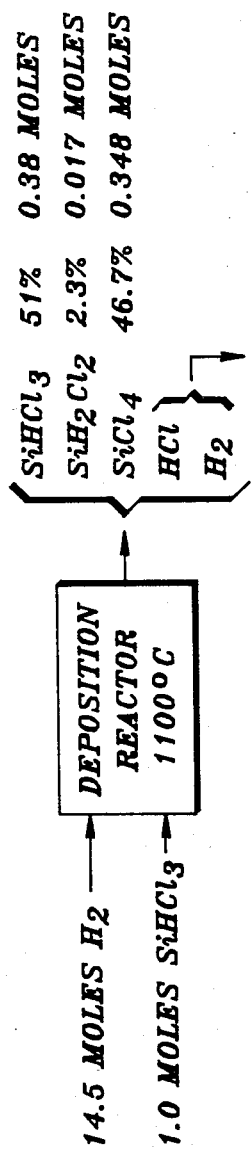
FIG. 3 illustrates the utilization of reactants in a silicon deposition reaction.

FIG. 3 illustrates the composition of reactants utilized for the deposition of polycrystalline silicon by the hydrogen reduction of trichlorosilane in a deposition reactor as described above, and also indicates the composition of the silicon-bearing effluent from the deposition reaction. The deposition reactor such as the refractory walled deposition box is heated to a temperature in the range of about 900°–1300° C. and preferably to a temperature of about 1100° C. In an optimum process the normalized starting point input reactants comprise about 1.0 moles of SiHCl$_3$ and about 14.5 moles of H$_2$. The Cl/H ratio and the Si/Cl ratio in the input gas stream are about 0.1 and 0.333, respectively. The effluent from the reaction includes HCl, H$_2$, SiHCl$_3$, SiH$_2$Cl$_2$, and SiCl$_4$. Of these, the HCl and H$_2$ are easily separated from the silicon-bearing compounds by condensation. The silicon-bearing effluent includes about 51% or 0.38 moles of SiCHl$_3$, 2.3% or 0.017 moles of SiH$_2$Cl$_2$, and 46.7% or 0.348 moles of SiCl$_4$. Of the one mole of silicon available in the input reactant train, about 0.254 moles of polycrystalline silicon is deposited. That is, while 25.4% of the input chlorosilane deposits as solid silicon, the other 74.6% is present in the silicon-bearing effluent gas stream as SiCl$_4$, SiHCl$_3$, and SiH$_2$Cl$_2$. These experimentally determined values are consistent with thermodynamic equilibrium calculations.

In accordance with the invention, the silicon-bearing effluent from the silicon deposition reaction is used as part of the input for a continuation of the reaction. By using the silicon-bearing effluent, the reaction is made more efficient in terms of utilization of the available silicon. Additionally, using the mixture of chlorosilanes as the input for the deposition reaction rather than pure trichlorosilane alone tends to improve the surface morphology of the deposited silicon and to minimize nodule and whisker formation during deposition. Most importantly, however, the use of the silicon-bearing effluent as an input to the deposition reaction reduces the cost of effluent recovery, since expensive distillation or other separation techniques are not needed to separate the various silicon-bearing constituents.

If the silicon-bearing effluent from the deposition reaction is fed directly back to the input in a continuous feedback process, however, the chemistry of the reaction will continuously change as the silicon content of the effluent changes. To overcome this problem and to continuously optimize the deposition reaction, the process is operated, in accordance with the invention, in a step-wise continuous fashion to approach a steady state condition. If the process is not operated at steady state but is instead constantly changing, the deposition rate and deposition parameters are constantly changing and the process is non-optimized.

Figure 4:
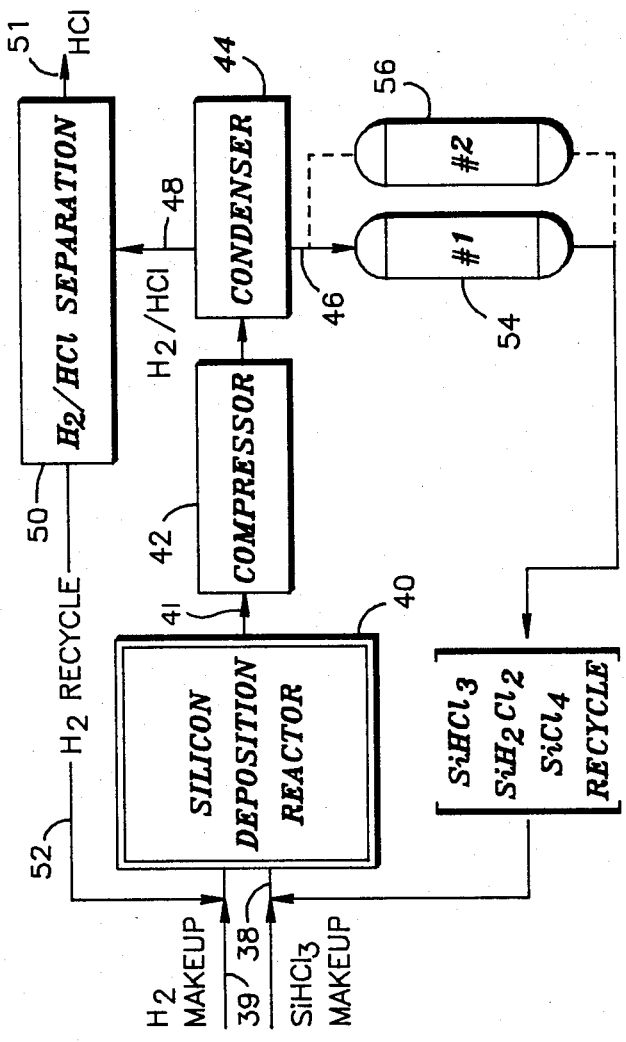
FIG. 4 illustrates a step-wise continuous deposition process in accordance with the invention.

The process in accordance with the invention is illustrated in FIG. 4. In this process the deposition of silicon is initiated by introducing trichlorosilane and hydrogen to a silicon deposition reactor 40. The SiHCl$_3$ and H$_2$ react at the elevated reactor temperature to deposit silicon on a heated substrate. The effluent from the deposition reactor passes through a compressor 42 and a condenser 44 to separate the silicon-bearing effluent 46 from the hydrogen and HCl effluent 48. The hydrogen and HCl are separated in a separator 50 which can be, for example, an activated charcoal adsorption bed. The HCl 51 is of no further use in this process. The hydrogen 52 is recycled and used as part of the hydrogen input 39. Silicon-bearing effluent 46, now in a liquid form, is collected in an accumulator 54. The silicon to chlorine ratio of the deposition reactor effluent 41 is determined by measuring HCl, SiH$_2$Cl$_2$, SiHCl$_3$ and SiCl$_4$ concentrations, for example, by gas chromatography. This ratio, (Si/Cl)$_{effluent}$, is given by $$(Si/Cl)_{effluent} = \frac{(SiH_2Cl_2 + SiHCl_3 + SiCl_4)}{HCl + 2\,SiH_2Cl_2 + 3\,SiHCl_3 + 4\,SiCl_4}.$$

The measured ratio and the known quantity of input reactants are used to determine the silicon deposition efficiency of this step from the equation $$\text{efficiency} = \frac{(Si/Cl)_{input} - (Si/Cl)_{effluent}}{(Si/Cl)_{input}} \times 100\%.$$

After the accumulator 54 is filled with the silicon-bearing effluent, this effluent is conveyed back to the input 38 of the silicon deposition reactor. Knowing the deposition efficiency of the previous step, an additional amount of make-up trichlorosilane and make-up hydrogen are added to this effluent. The make-up amount of trichlorosilane is determined, based upon a knowledge of the silicon deposition efficiency in the previous step, to maintain a constant flow of silicon through the deposition reactor. In the second step of the reaction, using the effluent in accumulator 54 as an input, silicon is deposited in the reactor and the resultant silicon bearing effluent is collected in accumulator 56. Again, the silicon deposition efficiency of this step is determined by composition analysis of the deposition reactor effluent 41. When accumulator 56 is filled with liquid chlorosilane effluent, the effluent collected in accumulator 56 is used, together with an amount of make-up trichlorosilane and hydrogen to continue the reaction. Again, the amount of make-up trichlorosilane is determined, based upon the measured silicon to chlorine ratio in the deposition reactor effluent 41 and the calculated deposition efficiency. In like manner the reaction is step-wise continued, using accumulators 54 and 56 for collecting the silicon-bearing effluent and subsequently supplying that effluent to the reactor input. After a few cycles of accumulation and recycle, dependent upon reactor geometry and efficiency, a steady state is reached in which the quantity and composition of the recycled silicon-bearing effluent are equal to those of the reaction effluent and all of the makeup trichlorosilane contributes to silicon deposition.

As the step-wise reaction continues, the amount of input hydrogen, including the recycled hydrogen plus an amount of make-up hydrogen, must be adjusted to maintain the desired ratio of chlorine to hydrogen at about 0.1. The amount of make-up hydrogen needed is calculated based upon the amount of silicon-bearing constituents being fed into the deposition reactor. The amount of input hydrogen necessary to keep the chlorine to hydrogen ratio constant varies slowly from an initial value of about 14.5 moles to an equilibrium value of about 16.5 moles.

During the deposition process the deposited polycrystalline silicon can be doped to a desired doping level by adding a controlled amount of dopant such as B$_2$H$_6$, BCl$_3$, PH$_3$, or the like to the input reactants. The dopant flow rate must be adjusted with each step of the step-wide continuous process to control and maintain the correct doping level as the input gas composition is changed. Control of the doping level can be easily maintained in the step-wise process by making an appropriate flow rate change commensurate with the changing silicon deposition efficiency at each step.

Figure 5:
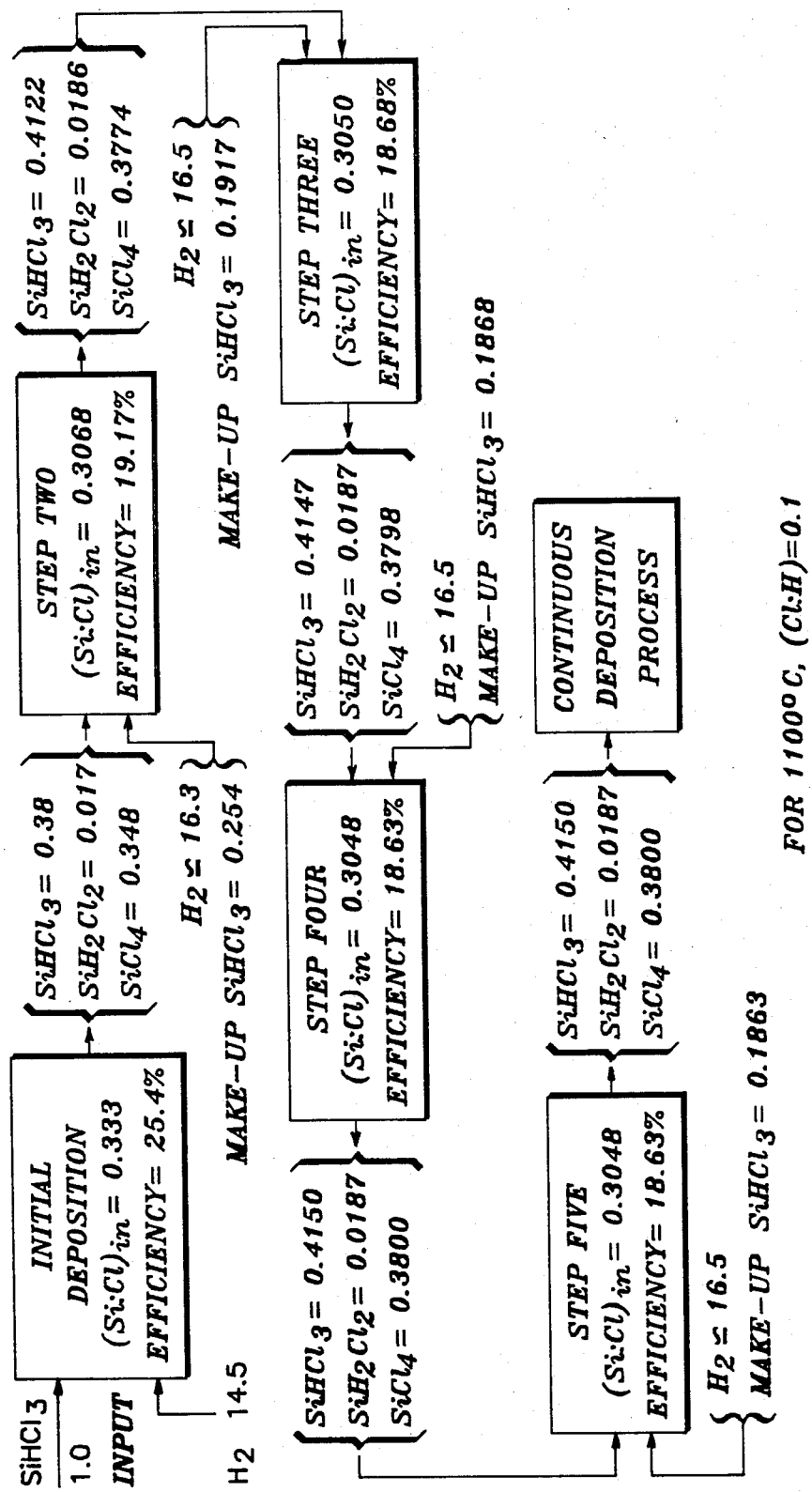
FIG. 5 illustrates a five-step deposition process for achieving equilibrium of reactants.

FIG. 5 illustrates a five step deposition process in accordance with the invention. At the end of the five steps, equilibrium is achieved and the process can be thereafter carried out as a continuous process. The results indicated in FIG. 5 are for a box type deposition system heated to about 1100° C. The deposition chamber comprises graphite coated molybdenum walls making up a box of square cross section approximately 10 cm. on a side and having a length of approximately 30 cm. The total flow rate through the deposition system is maintained at about 180 liters per minute for the initial step. In the process indicated in FIG. 5, reactant amounts are given in normalized moles. The efficiency in each of the individual deposition steps is calculated as the amount of silicon deposited divided by the total amount of available silicon in the input to that step, taken in percent.

The equilibrium efficiency of about 18.6% is lower than the efficiency of 25.4% which is realized by a process utilizing only trichlorosilane as the input silicon-bearing reactant. The lower deposition efficiency realized by the process in accordance with the invention, however, is more than overcome by the savings realized by utilizing all of the available silicon and by eliminating the need for a costly distillation step for separating out trichlorosilane from other silicon-bearing reactants.

Thus it is apparent that there has been provided, in accordance with the invention, an improved deposition process which fully meets the objects and advantages set forth above. While the invention has been described in conjunction with specific embodiments thereof, it is evident that many alternatives, modifications and variations will be apparent to those skilled in the art in the light of the foregoing description. The invention is applicable, for example, to deposition reactors of different design, different flow rates and different deposition temperatures. Accordingly, it is intended to embrace all such alternatives, modifications and variations as fall within the scope of the appended claims.

We claim:

1. A step-wise process for the efficient deposition of silicon which comprises the steps of:
   a. reacting trichlorosilane and hydrogen to deposit silicon on a substrate in a deposition reaction;
   b. measuring the ratio of silicon to chlorine in the effluent from the said reaction;
   c. determining from said ratio the amount of silicon deposited;
   d. collecting a quantity of silicon bearing effluent from said reaction;
   e. continuing said deposition reaction using said quantity of silicon bearing effluent together with an additional quantity of trichlorosilane as an input to said deposition reaction, said additional quantity determined to make up the amount of silicon deposited in said deposition reaction;
   f. and repeating steps b through e until a steady-state equilibrium is reached between deposition reactor input and effluent.

2. The process of claim 1 further comprising: continuing said deposition in a continuous manner after said steady-state equilibrium is reached.

3. In a process for depositing silicon wherein a silicon bearing reactant and hydrogen are reacted in a deposition reactor to deposit silicon on a substrate and wherein a silicon-bearing effluent is produced, the improvement which comprises: reacting trichlorosilane and hydrogen to initiate said process and to deposit an amount of silicon; thereafter, in a step-wise manner, collecting a quantity of said effluent, and using said quantity of said effluent together with an amount of trichlorosilane as reactant input to the next step of said process, said amount of trichlorosilane determined to make up said amount of silicon deposited.

4. The process of claim 3 wherein the improvement further comprises: after equilibrium is achieved, continuing said process in a continuous manner with said silicon-bearing effluent together with an additional amount of trichlorosilane used directly as an input.

5. The process of claim 3 wherein the improvement further comprises: adjusting the amount of hydrogen input to each step of said process to maintain a predetermined ratio of chlorine to hydrogen.

6. The process of claim 5 wherein said predetermined ratio is about 0.1.

7. The process of claim 3 wherein the improvement further comprises adding an amount of dopant to each step of said process.

8. The process of claim 7 wherein said amount of dopant is adjusted with each step of said process to maintain a predetermined doping level.

9. The process of claim 3 wherein said silicon-bearing reactant and said hydrogen are reacted in a box system and wherein said substrate comprises interior walls of said box.

10. The process of claim 9 wherein said box comprises demountable sides.

11. The process of claim 3 wherein said amount of silicon deposited is determined by measuring the silicon to chlorine ratio of said deposition reactor effluent.

* * * * *